(12) United States Patent
Han et al.

(10) Patent No.: US 10,448,529 B2
(45) Date of Patent: Oct. 15, 2019

(54) ELECTRONIC DEVICE

(71) Applicant: Samsung Electronics Co., Ltd., Suwon-si, Gyeonggi-do (KR)

(72) Inventors: Soon-Ho Han, Hwaseong-si (KR); Jong-In Ryu, Suwon-si (KR); Byoung-Uk Yoon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 69 days.

(21) Appl. No.: 15/044,748

(22) Filed: Feb. 16, 2016

(65) Prior Publication Data
US 2016/0255735 A1 Sep. 1, 2016

(30) Foreign Application Priority Data
Feb. 27, 2015 (KR) ........................ 10-2015-0028368

(51) Int. Cl.
*H05K 5/03* (2006.01)
*G06F 1/16* (2006.01)
(Continued)

(52) U.S. Cl.
CPC ............... *H05K 5/03* (2013.01); *B32B 17/06* (2013.01); *G02F 1/133351* (2013.01);
(Continued)

(58) Field of Classification Search
CPC .......... G02B 27/141; G02B 5/20; G02B 5/22; G02B 5/26; H05K 5/00–069; H05K 7/00–2099
See application file for complete search history.

(56) References Cited

U.S. PATENT DOCUMENTS

2007/0026197 A1* 2/2007 Suga ................. B29C 45/14811
428/172
2010/0060548 A1 3/2010 Choi et al.
(Continued)

FOREIGN PATENT DOCUMENTS

| CN | 101674361 A | 3/2010 |
| CN | 103781296 A | 5/2014 |

(Continued)

OTHER PUBLICATIONS

European Result of Consultation dated Nov. 9, 2018, issued in European Application No. 16157342.3.
(Continued)

*Primary Examiner* — Evan P Dzierzynski
*Assistant Examiner* — Sharrief I Broome
(74) *Attorney, Agent, or Firm* — Jefferson IP Law, LLP

(57) ABSTRACT

An electronic device on which an exterior surface mounting member is mounted is provided. The electronic device includes an external housing including a first plate and a second plate that is directed opposite to the first plate, and at least one electronic component that is included within the external housing. The first plate may include a transparent plate including a first surface that forms an outer surface of the first plate and a second surface that is directed opposite to the first surface, and a structure that is interposed between the transparent plate and the second plate, and includes a third surface that faces the first plate and a fourth surface that is formed opposite to the third surface, the structure containing a transparent or translucent material.

6 Claims, 17 Drawing Sheets

(51) Int. Cl.
*H05K 5/00* (2006.01)
*B32B 17/06* (2006.01)
*G02F 1/1333* (2006.01)
*H04M 11/00* (2006.01)

(52) U.S. Cl.
CPC .......... *G06F 1/1626* (2013.01); *G06F 1/1637* (2013.01); *G06F 1/1647* (2013.01); *H04M 11/00* (2013.01); *H05K 5/0017* (2013.01); *H05K 5/0086* (2013.01); *B32B 2457/208* (2013.01)

(56) References Cited

U.S. PATENT DOCUMENTS

| | | | |
|---|---|---|---|
| 2013/0164493 A1 | 6/2013 | Hirai | |
| 2013/0236699 A1 | 9/2013 | Prest et al. | |
| 2014/0113089 A1* | 4/2014 | Liu | C23C 14/20 428/34.6 |
| 2014/0184471 A1* | 7/2014 | Martynov | G06F 3/1423 345/1.2 |
| 2014/0268590 A1* | 9/2014 | Kim | H05K 5/03 361/748 |
| 2015/0212626 A1* | 7/2015 | Kim | H04M 1/0268 345/174 |
| 2016/0016845 A1* | 1/2016 | Cho | C03C 15/00 428/157 |
| 2016/0334896 A1* | 11/2016 | Koike | B32B 15/02 |

FOREIGN PATENT DOCUMENTS

| | | |
|---|---|---|
| CN | 104050881 A | 9/2014 |
| EP | 2778145 A1 | 9/2014 |
| KR | 10-1257883 B1 | 4/2013 |
| KR | 10-2013-0071941 A | 7/2013 |
| KR | 10-2014-0070046 A | 6/2014 |
| KR | 10-1440081 B1 | 9/2014 |
| WO | 2014137058 A1 | 9/2014 |

OTHER PUBLICATIONS

European Decision dated Nov. 28, 2018, issued in European Application No. 161573423.

Chinese Office Action dated May 13, 2019, issued in a counterpart Chinese application No. 201610101357.8.

* cited by examiner

ELECTRONIC DEVICE

CROSS-REFERENCE TO RELATED APPLICATION(S)

This application claims the benefit under 35 U.S.C. § 119(a) of a Korean patent application filed on Feb. 27, 2015 in the Korean Intellectual Property Office and assigned Ser. No. 10-2015-0028368, the entire disclosure of which is hereby incorporated by reference.

TECHNICAL FIELD

The present disclosure relates to a transparent surface member that is mounted on an exterior surface in an electronic device, such as a window glass.

BACKGROUND

A surface member mounted on the exterior surface of an electronic device, such as a window glass, is subjected to a polishing process in order to address the issues of chipping and sharpness that occur on a surface that is subjected to periphery shape machining.

At this time, the periphery region of a window glass may exhibit an effect, like a lens, due to a round shape that is produced thereon.

Meanwhile, a decoration pattern film or shape may be applied to the rear face of the exterior surface mounting member in order to apply various design effects.

Such a pattern may look distorted in a peripheral portion of the exterior surface mounting member due to a rounded surface effect (curvature effect). Such a phenomenon may be further conspicuous especially in a decoration pattern with high luminance.

In the case of a decoration of an existing exterior surface mounting member, a portion of a decoration pattern looks distorted in a rounded region (curvature region) that is formed on the periphery of an exterior surface mounting member.

Therefore, a need exists for a transparent surface member that is mounted on an exterior surface in an electronic device, such as a window, to prevent glass chipping and sharpness that occur on a surface that is subjected to periphery shape machining.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a transparent surface member that is mounted on an exterior surface in an electronic device, such as a window glass.

Various embodiments of the present disclosure are to prevent distortion of a decoration pattern, which may occur in a rounded region in the periphery of an exterior, thereby improving exterior quality.

In accordance with an aspect of the present disclosure, an electronic device is provided. The electronic device includes an external housing including a first plate and a second plate that is directed opposite to the first plate, and at least one electronic component that is included within the external housing. The first plate may include a transparent plate including a first surface that forms an outer surface of the first plate and a second surface that is directed opposite to the first surface, and a structure that is interposed between the transparent plate and the second plate, and includes a third surface that faces the first plate and a fourth surface that is formed opposite to the third surface, the structure containing a transparent or translucent material. The transparent plate may include a first region having a first thickness, and a second region that is positioned adjacent to the first region and has a second thickness that is smaller than the first thickness. When viewed from a cross section, a thickness from the second surface to the first surface in the second region may be reduced in a direction away from the first region. The structure may include a pattern of repeated protrusions within a portion on the fourth surface which corresponds to the first region, and the protrusions are parallel to each other in a first direction.

In accordance with another aspect of the present disclosure, a portable electronic device is provided. The portable electronic device includes an external housing including a first surface and a second surface that is directed opposite to the first surface. At least a portion of at least one of the first surface and the second surface may include a first layer that is transparent and forms at least a portion of an outer surface of the first surface, a second layer including a material that is different from that of the first layer, the second layer facing the first layer, a third layer including a material that is different from those of the first and second layers, in which the third layer is interposed between the first layer and second layer, a fourth layer including a material that is different from the first, second, and third layers and has reflexibility, the fourth layer being interposed between the second layer and the third layer. The third layer may include a pattern of repeated protrusions, which protrude from an interface between the third layer and the fourth layer toward the second surface.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
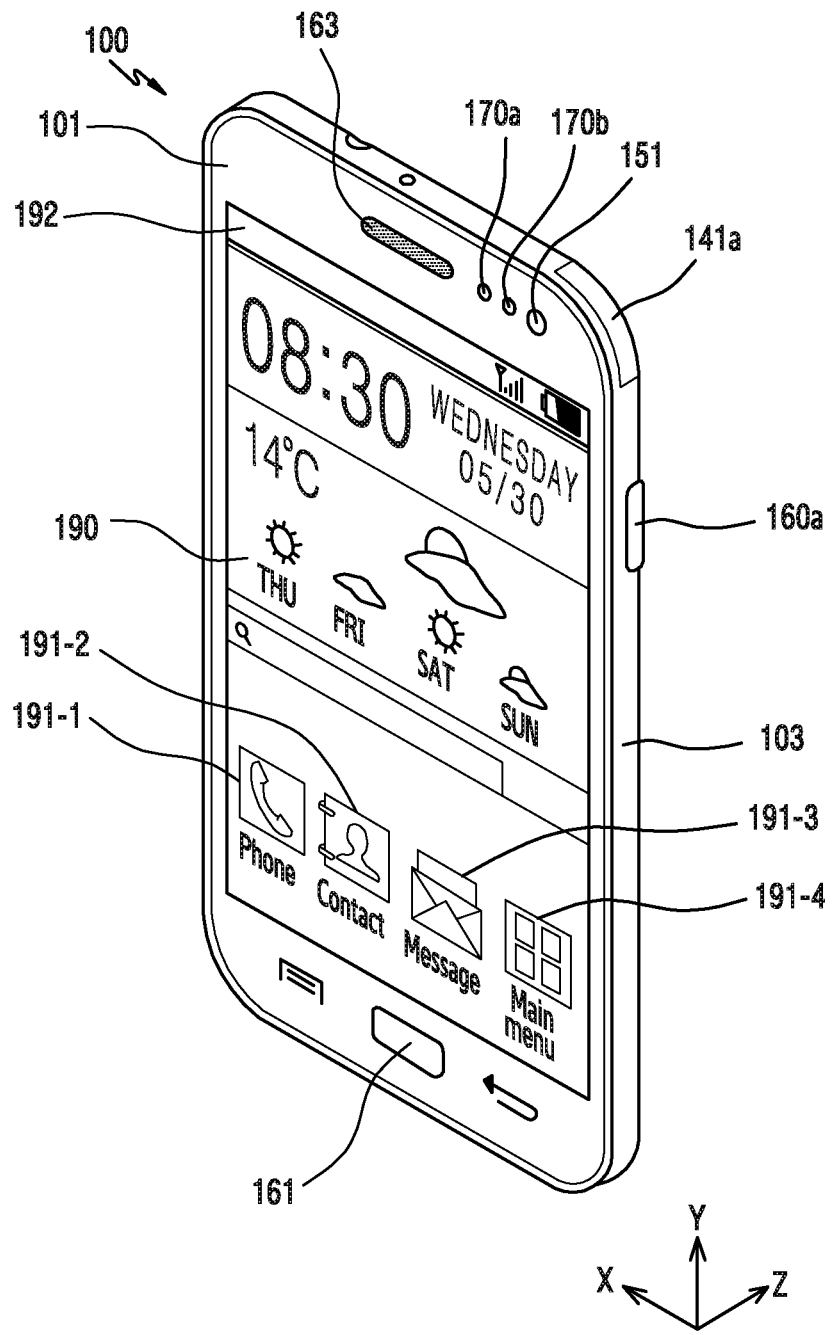
FIG. 1 is a perspective view illustrating a front surface of an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The terms "include" or "may include" used in the various embodiments of the present disclosure indicate the presence of disclosed corresponding functions, operations, elements, and the like, and do not limit additional one or more functions, operations, elements, and the like. In addition, it should be understood that the terms "include" or "have" used in the various embodiments of the present disclosure are to indicate the presence of features, numbers, operations, elements, parts, or a combination thereof described in the specifications, and do not preclude the presence or addition of one or more other features, numbers, operations, elements, parts, or a combination thereof.

The term "or" used in the various embodiments of the present disclosure include any and all combinations of words enumerated with it. For example, "A or B" indicate including A, including B, or including both A and B.

Although the terms, such as "first" and "second" used in the various embodiments of the present disclosure may modify various elements of the various embodiments of the present disclosure, these terms do not limit the corresponding elements. For example, these terms do not limit an order and/or importance of the corresponding elements. These terms may be used for the purpose of distinguishing one element from another element. For example, a first electronic device and a second electronic device all indicate electronic devices and may indicate different electronic devices. For example, a first element may be named a second element without departing from the scope of right of the various embodiments of the present disclosure, and similarly, a second element may be named a first element.

It will be understood that, when an element is mentioned as being "connected" or "coupled" to another element, the element may be directly connected or coupled to another element, and there may be an intervening element between the element and another element. To the contrary, it will be understood that, when an element is mentioned as being "directly connected" or "directly coupled" to another element, there is no intervening element between the element and another element.

The terms used in the various embodiments of the present disclosure are for the purpose of describing specific embodiments of the present disclosure only and are not intended to limit various embodiments of the present disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. The terms defined in a generally used dictionary should be interpreted as having the same meanings as the contextual meanings of the relevant technology and should not be interpreted as having ideal or exaggerated meanings unless they are clearly defined in the various embodiments of the present disclosure.

An electronic device according to various embodiments of the present disclosure may be a device that is equipped with a communication function. For example, the electronic device may include at least one of a smartphone, a tablet personal computer (PC), a mobile phone, a video phone, an electronic book reader, a desktop PC, a laptop PC, a netbook computer, a personal digital assistant (PDA), a portable multimedia player (PMP), a moving picture experts group (MPEG-1 or MPEG-2) audio layer 3 (MP3) player, a mobile medical machine, a camera, or a wearable device (for example, a head-mounted-device (HMD), such as electronic glasses, electronic clothing, an electronic bracelet, an electronic necklace, an electronic appcessory, electronic tattoos, a smart watch, and the like).

The electronic device according to various embodiments of the present disclosure may be one or a combination of one or more of the above-mentioned devices. In addition, the electronic device according to various embodiments of the present disclosure may be a flexible device. In addition, it is obvious to an ordinary skilled person in the related art that the electronic device according to various embodiments of the present disclosure is not limited to the above-mentioned devices.

FIG. 1 is a perspective view illustrating a front face of an electronic device according to various embodiments of the present disclosure.

Figure 2:
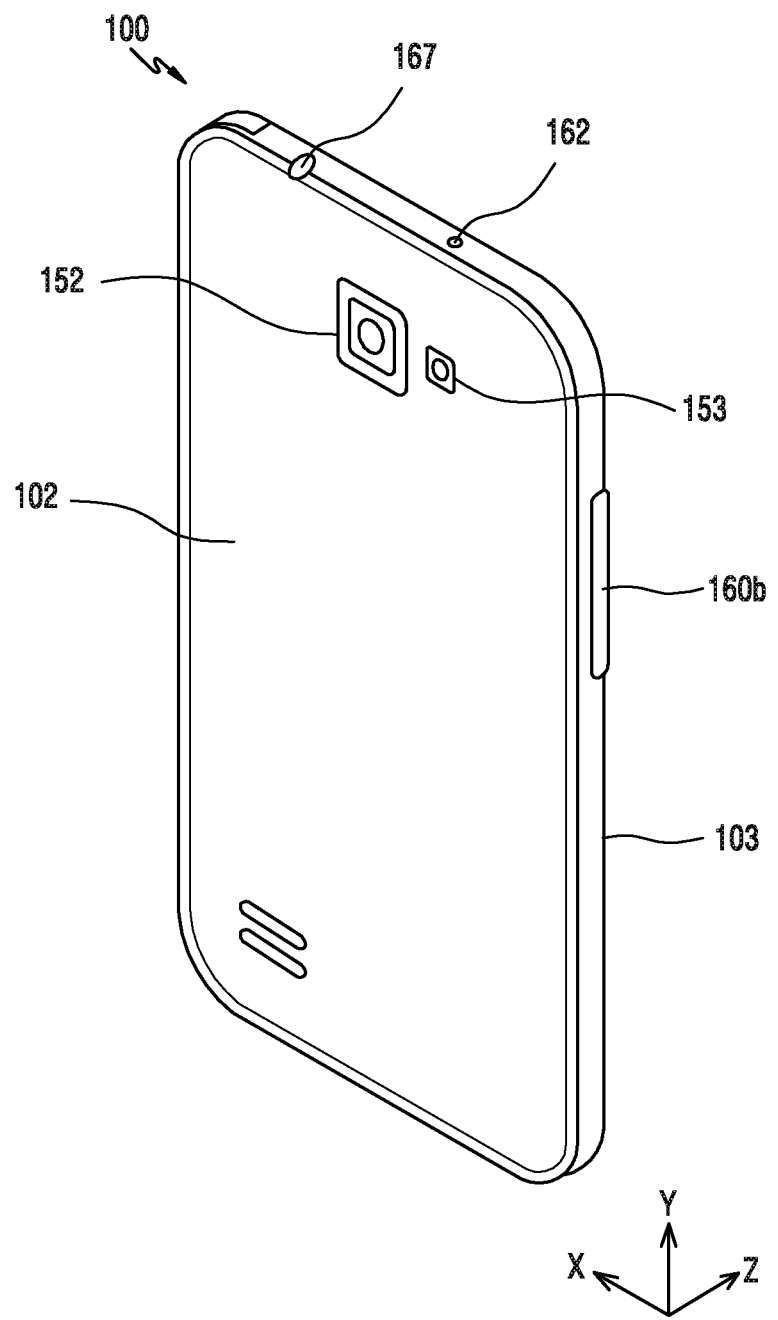
FIG. 2 is a perspective view illustrating a rear face of an electronic device according to various embodiments of the present disclosure.

FIG. 2 is a perspective view illustrating a rear face of an electronic device according to various embodiments of the present disclosure.

Referring to FIGS. 1 and 2, in the orthogonal coordinate system, the X-axis indicates the width direction of the electronic device, the Y-axis indicates the length direction of the electronic device, and the Z-axis indicates the thickness direction of the electronic device.

Referring to FIGS. 1 and 2, according to various embodiments of the present disclosure, an electronic device 100 may include a front face 101, a side face rim 103, and a rear face 102. A touch screen 190 may be placed on the front face 101 of the electronic device. For example, the touch screen 190 is formed in a large size to occupy a great portion of the front face 101 of the electronic device 100. FIG. 1 illustrates an example in which a main home screen is displayed on the touch screen 190. The main home screen refers to the first screen that is displayed on the touch screen 190 when the power of the electronic device 100 is turned on. In addition, when the electronic device 100 has several pages of different home screens, the main home screen may be the first home screen among the several pages of different home screens. The home screen may display shortcut icons 191-1, 191-2, and 191-3 to execute frequently used applications, a main menu switching key 191-4, time, weather, and the like. The main menu switching key 191-4 may cause the main screen to be displayed on the touch screen 190. In addition, in the upper end of the touch screen 190, status bars 192 may be formed to indicate the statuses of the electronic device 100, such as a battery charge status, a received signal strength, a current time, and the like. Below the touch screen 190, a home button 161 is arranged, and a menu button and a back button may be formed on the opposite sides of the home button 161, respectively.

According to various embodiments of the present disclosure, the home button 161 causes the main home screen to be displayed on the touch screen 190. For example, when the home button 161 is touched in the state where a home screen, which is different from the main home screen, or the menu screen is displayed on the touch screen 190, the main home screen may be displayed on the touch screen 190. In addition, when the home button 161 is touched while applications are executed on the touch screen 190, the main home screen illustrated in FIG. 1 may be displayed on the touch screen 190. In addition, the home button 161 may be used in order to cause the touch screen 190 to display the most recently used application or a task manager.

According to various embodiments of the present disclosure, the menu button provides a connection menu that may be used on the touch screen 190. The connection menu may include a widget addition menu, a background screen change menu, a retrieve menu, an edition menu, an environment setting menu, and the like. The back button may cause the screen, which was executed just prior to the currently executed screen, to be displayed, or may cause the most recently used application to be terminated.

According to various embodiments of the present disclosure, a first camera 151, an illuminance sensor 170a, a proximity sensor 170b, and a receiver 163 may be arranged in an edge of the front face 101 of the electronic device 100. A second camera 152 and a flash 153 may be arranged on the rear face 102 of the electronic device 100.

According to various embodiments of the present disclosure, for example, a power/reset button 160a, a volume button 160b, a terrestrial digital media broadcasting (DMB) antenna 141a for broadcasting reception, one or more mics 162, and the like, may be arranged on the side face 103 of the electronic device 100. The DMB antenna 141a may be fixed to the electronic device 100, or may be formed to be removable from the electronic device 100.

According to various embodiments of the present disclosure, a connector is formed on the lower end side face of the electronic device 100. The connector is formed with a plurality of electrodes, and may be connected to an external device through a wire. An earphone connecting jack 167 may be arranged on the upper end side face of the electronic device 100. An earphone may be inserted into the earphone connecting jack 167. The earphone connecting jack 167 may be arranged on the lower end side face of the electronic device 100.

According to various embodiments of the present disclosure, the electronic device 100 may include a surface transparent member that is mounted on the front face thereof, such as a tempered glass (e.g., a window glass). In addition, the electronic device includes four corner regions, which may be formed to be angled or to be rounded. Accordingly, the window glass may be formed to have four corner regions which are angled or rounded.

Figure 3B:
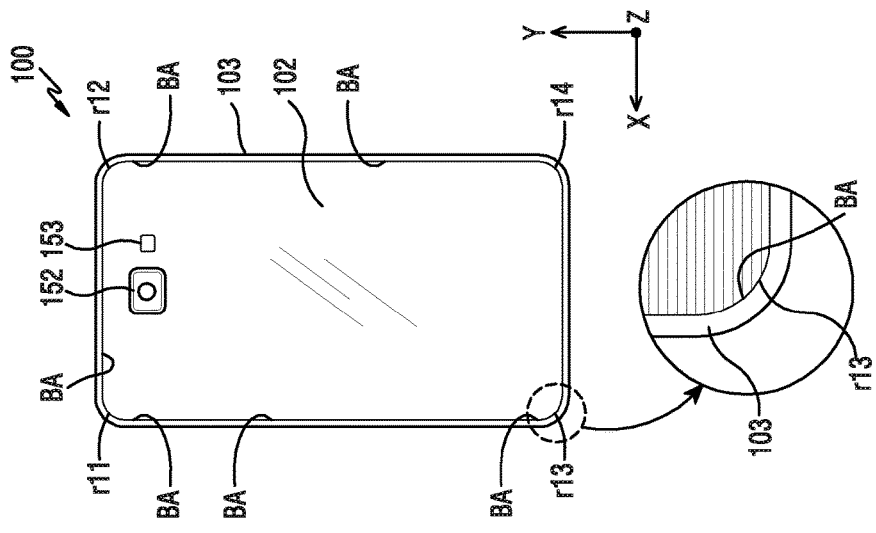
FIGS. 3A and 3B are front and rear views, respectively, illustrating an electronic device according to various embodiments of the present disclosure.
Figure 3A:
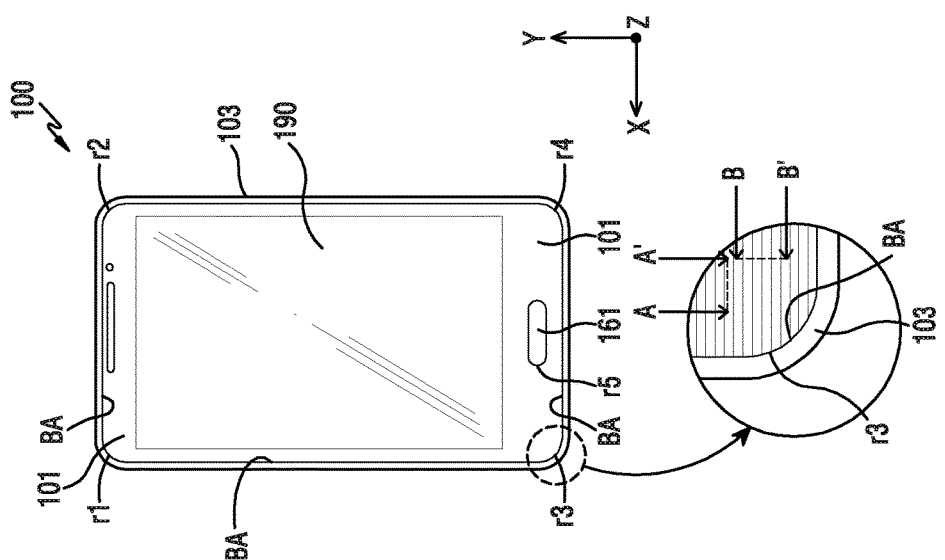

FIGS. 3A and 3B are front and rear views, respectively, illustrating an electronic device according to various embodiments of the present disclosure.

Referring to FIGS. 3A and 3B, according to various embodiments of the present disclosure, an exterior surface mounting member may be mounted on at least a portion of the front face 101 or the rear face 102 of the electronic device 100. The exterior surface mounting member may refer to a component that is mounted to cover at least a portion of the touch screen in the front face 101 of the electronic device, and may also refer to a component that is mounted to cover or to avoid at least a portion of a region in which the camera 152 and the flash 153 are arranged in the rear face 102 of the electronic device.

According to various embodiments of the present disclosure, the rim 103 of the electronic device may be made of a metal or an injection-molded material. For example, the electronic device includes an external housing, which may include a first plate (a front cover) on the front face and a second plate (a rear cover) on the rear face.

According to various embodiments of the present disclosure, the first plate may include a first surface (an outer surface) and a second surface (a bottom surface that is positioned inside) that is directed to the opposite side to the first surface. The second plate may include a third surface (an inner surface that faces the first plate) and a fourth surface (external surface) that is directed to the opposite side to the third surface. A structure containing a transparent or translucent material may be arranged between the first and second plates.

According to various embodiments of the present disclosure, the electronic device may include the display (including the touch screen) in the central area of the front face, and the display may be exposed through a portion of the first plate. In addition, the display may be exposed through the second plate. According to various embodiments of the present disclosure, the structure may be formed outside the display.

For example, the exterior surface mounting member, which is positioned on the exterior surface of the electronic device, may refer to a component that should be scratch-resistant and should be contributed to the exterior design of the electronic device. Accordingly, the exterior surface mounting member may be provided with various visible patterns.

According to various embodiments of the present disclosure, the exterior surface mounting member, which is mounted on the front face 101 or the rear face 102 of the electronic device, is provided with a pattern layer based on exterior design. In the pattern layer, the pattern distortion phenomenon excessively occurs in an edge portion BA of the front face of the electronic device, in particular in the corner regions r1 to r4 that are formed in a rounded shape. The edge portion BA may be an end portion of the exterior surface mounting member, and may be an interface region between the exterior surface mounting member and the rim 103.

According to various embodiments of the present disclosure, in the pattern layer, the pattern distortion phenomenon occurs excessively in the edge portion BA of the rear face 102 of the electronic device, in particular, in the corner regions r11 to r14. The edge portion BA may be the outermost edge of the exterior surface mounting member or an end portion of a peripheral area around a portion that has a hole formed in the inside thereof, and may be an interface region between the exterior surface mounting member and the rim 103.

With reference to FIGS. 4 to 8, descriptions will be made below on a configuration of the exterior surface mounting member according to various embodiments of the present disclosure and a pattern distortion phenomenon.

Figure 4:
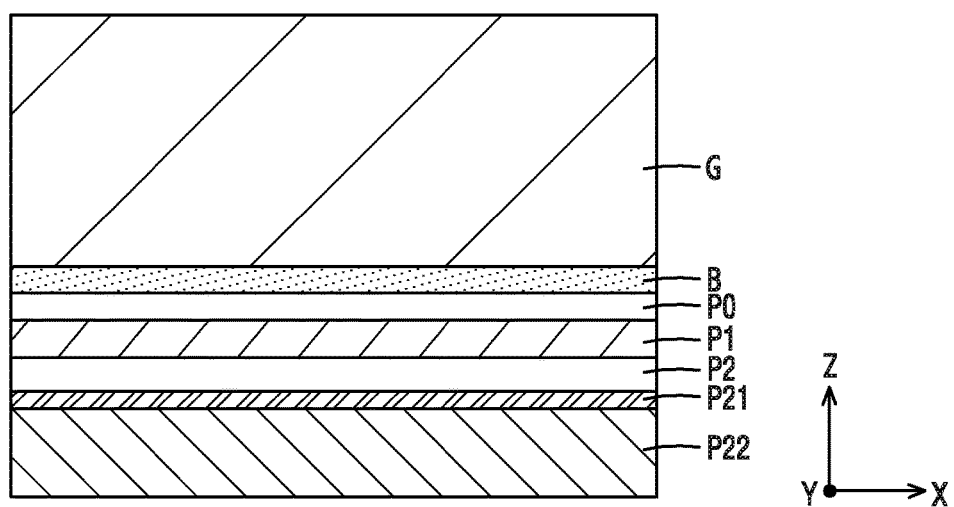
FIG. 4 is a cross-sectional view taken along line A-A' in FIG. 3A and illustrating a configuration of an exterior surface mounting member that is adopted in an electronic device according to various embodiments of the present disclosure.
Figure 5:
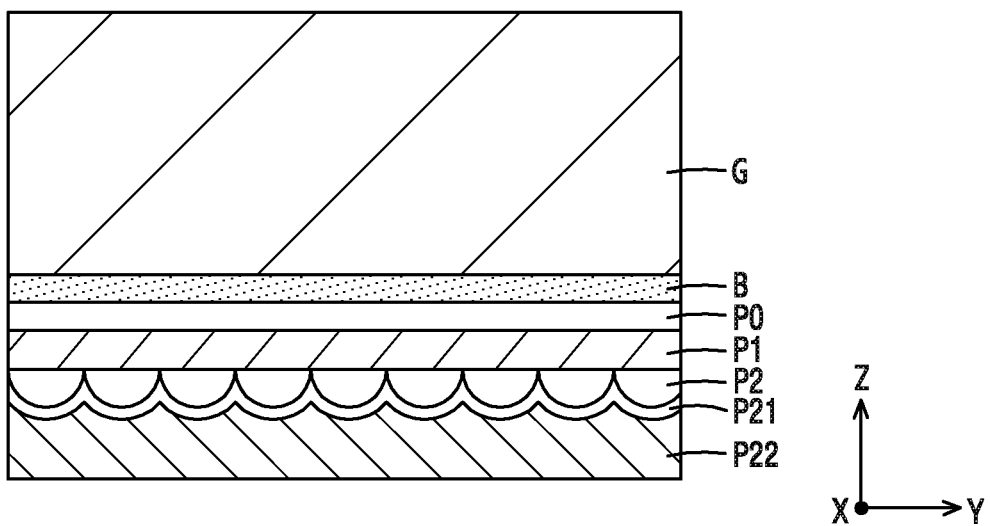
FIG. 5 is a cross-sectional view taken along line B-B' in FIG. 3A and illustrating a configuration of an exterior surface mounting member that is adopted in an electronic device according to various embodiments of the present disclosure.

FIGS. 4 and 5 are cross-sectional views illustrating a configuration of an exterior surface mounting member that is adopted in an electronic device according to various embodiments of the present disclosure.

Referring to FIGS. 4 and 5, according to various embodiments of the present disclosure, it is necessary for a component, which is mounted on the front face or the rear face of the external housing of the electronic device, to be scratch-resistant and be provided with a design-related pattern.

According to various embodiments of the present disclosure, the exterior surface mounting member may consist of a plurality of layers, and may include first, second, third, and fourth layers. The external housing includes a first surface and a second surface that is opposite to the first surface, and the exterior surface mounting member may be mounted on at least a portion of at least one of the first surface and the second surface.

According to various embodiments of the present disclosure, the exterior surface mounting member may include a first layer G that is substantially transparent and may form at least a portion of the outer surface of the first surface. The first layer G may include a glass plate. In addition, the first layer G may be made of any one of tempered glass and reinforced ceramic. The transparent plate G may be made of a material other than the tempered glass and the reinforced ceramic.

According to various embodiments of the present disclosure, the exterior surface mounting member may include a material that is different from that of the first layer G, and may include a second layer P22 that faces the first layer G. The second layer P22 may be made of an opaque material, and may include a base printed layer.

According to various embodiments of the present disclosure, the exterior surface mounting member may include a material that is different from those of the first layer G and the second layer P22, and may include third layers P1 and P2 that are interposed between the first layer G and the second layer P22. The third layers P1 and P2 may include a pattern of repeated protrusions which protrudes from an interface between the third layers P1 and P2 and a fourth layer P21 toward the second surface. In addition, the third layers P1 and P2 may include one or more ultraviolet (UV)-curable resin layers. The UV-curable resin layer may be made of any one of acrylate and polyurethane. The third layers may include first and second pattern layers P1 and P2. The first pattern layer P1 may be a first UV-curable resin layer, and the second pattern layer P2 may be a second UV-curable resin layer. The first UV-curable resin layer P1 may include the second UV-curable resin layer P2 as described below, and may be attached to the bottom portion of the adhesive layer B.

The second UV-curable resin layer P2 may be made of a material that is the same as the first UV-curable resin layer P1, and may be provided below the first UV-curable resin layer P1 in a defined pattern shape to cause a diffusion of light that passes through the first UV-curable resin layer P1.

According to various embodiments of the present disclosure, the second UV-curable resin layer P2 may be formed with a defined pattern. The pattern may be preferably formed as any one of a lenticular pattern, a three-dimensional pattern, such as hologram, and a molding pattern so as to implement diffusion of incident light. Here, the pattern may be any other decoration pattern, and any other pattern may also be available. In addition, the pattern of the second UV-curable resin layer P2 may be configured in a shape in which a plurality of concave portions and a plurality of convex portions are alternately arranged.

According to various embodiments of the present disclosure, the second UV-curable resin layer P2 may be provided in the form of covering generally the entire region of the first UV-curable resin layer P1. The second UV-curable resin layer P2 is provided in the form of a defined pattern or particles generally over the entire region, but may be provided in a specific form in a specific region. For example, the pattern may be removed in a defined rim shape along the peripheral surface of the transparent plate G to be provided as a flat surface (as will be described below with reference to FIGS. 10 and 12).

According to various embodiments of the present disclosure, the exterior surface mounting member may include a fourth layer P21 that includes a material, which is different from those of the first layer G and the third layers P1 and P2 and has reflexibility, and is interposed between the second layer P22 and the third layers P1 and P2. The fourth layer P21 may include a metal material, and may be formed through multi-deposition.

According to various embodiments of the present disclosure, the exterior surface mounting member may further include a fifth layer P0 that is interposed between the first layer G and the third layers P1 and P2 and have a material that is different from those of the first layer G and the third layers P1 and P2. The fifth layer P0 may include a polymer (PET) film layer. The polymer film layer may be made of poly ethylene terephthalate (PET), poly methyl methacrylate (PMMA), and poly carbonate (PC). The thickness of the polymer film layer P0 may be 0.05 mm to 0.15 mm. In addition, the thickness of the polymer film layer P0 may also be 0.05 mm or less, or 0.15 or more. The polymer film layer P0 may be attached to the bottom portion of the plate G by an adhesive B.

According to various embodiments of the present disclosure, the exterior surface mounting member may include an adhesive layer B between the first layer G and the fifth layer P0. The adhesive layer B may be configured using an optical clean adhesive (OCA).

The exterior surface mounting member according to an embodiment of the present disclosure is applicable to an electronic device (not illustrated) as a representative application example. However, the present disclosure is applicable to various types of applications without being limited to the electronic device described above.

The electronic device according to the embodiment of the present disclosure includes all information and communication devices and multimedia devices, such as a PMP, an MP3 player, a navigation, a game player, a notebook, a netbook, an advertising panel, a television (TV), a digital broadcasting receiver, a PDA, and a smart phone, as well as all kinds of mobile communication terminals which operate according to communication protocols corresponding to various communication systems, and application devices thereof.

In the exterior surface mounting member fabricated as described above, light may be incident on the transparent plate G, and then may pass through the adhesive layer B. After passing through the adhesive layer B, the light may be incident on and pass through the first UV-curable resin layer P1. After passing through the first UV-curable resin layer P1, the light passes the second UV-curable resin layer P2 that is the same material as the first UV-curable resin layer P1, and then is reflected from the fourth layer P21 that is positioned on the rear face of the second UV-curable resin layer P2 such that the light can be visually recognized by the user with a design effect.

The top surface of the transparent plate G may be preferably formed in a flat or rounded shape. For example, the top surface of the transparent plate G may be formed in any of a 2.5D shape and a 3D shape which have a rounded shape. When manufacturing the transparent plate G, a peripheral cutting region generates chipping or a sharp edge due to machining, and thus, chamfer cutting and polishing processes are performed in order to trim the chipping or the sharp edge.

After the processes have been performed, the periphery of the transparent plate G may have an approximately rounded shape, and the rounded region acts as a factor that causes distortion of light, like a lens, with respect to the incident light and the reflected light.

Figure 6:
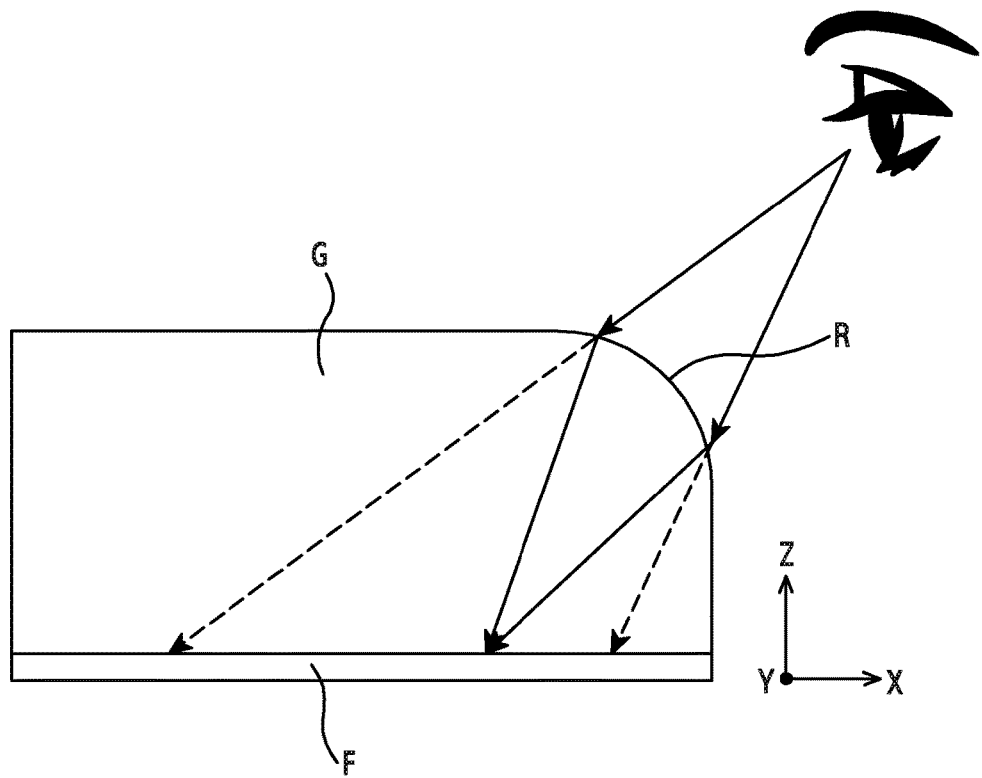
FIG. 6 is a view illustrating a principle that causes a distortion phenomenon to occur in an outermost edge (periphery) of a transparent plate or a rounded region that is formed around an area of the transparent plate, in which a hole is formed, according to various embodiments of the present disclosure.

FIG. 6 is a view illustrating a principle that causes a distortion phenomenon to occur in an outermost edge (periphery) of a transparent plate or a rounded region that is formed around an area of the transparent plate, in which a hole is formed, according to various embodiments of the present disclosure.

Figure 7:
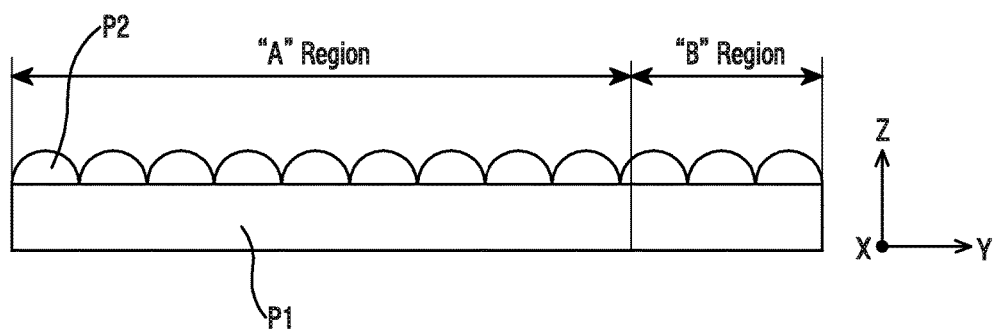
FIG. 7 is a view illustrating a portion, in which a distortion phenomenon of a pattern layer occurs, in an exterior surface mounting member according to various embodiments of the present disclosure.

FIG. 7 is a view illustrating a portion, in which a distortion phenomenon of a pattern layer occurs, in an exterior surface mounting member according to various embodiments of the present disclosure.

Figure 8:
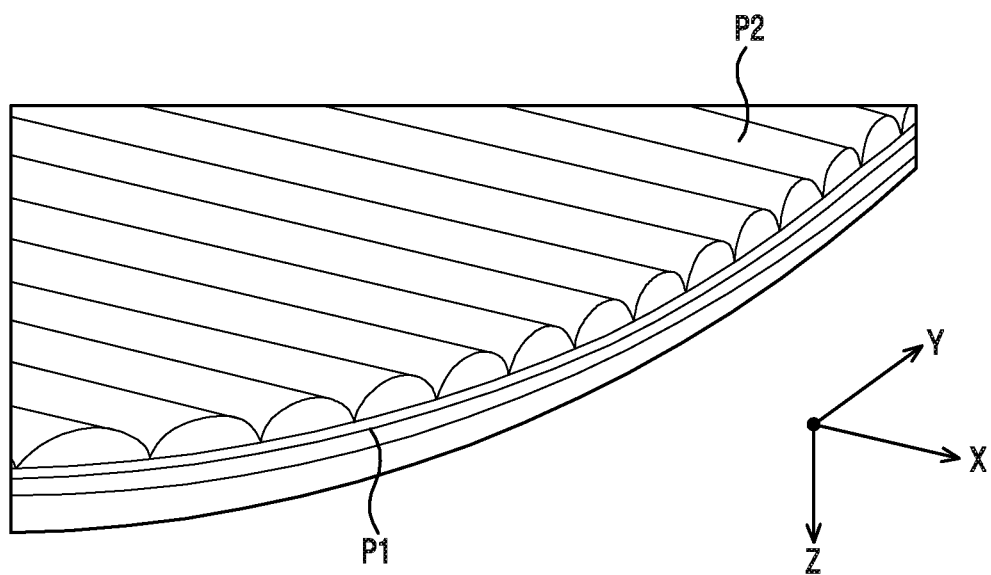
FIG. 8 is a perspective view illustrating a portion, in which a distortion phenomenon of a pattern layer occurs, in an exterior surface mounting member according to various embodiments of the present disclosure.

FIG. 8 is a perspective view illustrating a portion, in which a distortion phenomenon of a pattern layer occurs, in an exterior surface mounting member according to various embodiments of the present disclosure.

Referring to FIGS. 6, 7, and 8, the first and second decoration pattern layers P1 and P2 (which may also be referred to as first and second UV-curable resign layers) are provided in the form of generally covering the entire rear surface of the transparent plate G. In the case of a decoration pattern layer that overlaps with the rounded region R of the transparent plate G (the outermost edge or a portion around or a portion that has a hole formed therein), the pattern shape may be visually recognized as a shape that is different from the original shape due to the distortion effect. Such an effect may be recognized as a quality issue for the peripheral region of the exterior surface mounting member. In FIG. 7, while the pattern of the pattern layer in the "A" region is not distorted, but the pattern of the pattern layer in the "B" region may be distorted. The "A" region (first region) may have a first thickness, and the "B" region (second region) may have a thickness that is smaller than the first thickness while being located adjacent the "A" region. When viewed from a cross section, the thickness from the second surface to the first surface in the above-mentioned regions may decrease in a direction away from the first region.

A structure according to various embodiments of the present disclosure may include a pattern of repeated protrusions within the portion that corresponds to the "A" region on the fourth surface (outer surface of the second plate). In addition, the "B" region in the fourth surface may include an elongated flat portion that B.

Various embodiments of the present disclosure can prevent the distortion phenomenon of the pattern layer P2 by excluding the pattern of the pattern layer P2, which overlaps with the rounded region of the transparent plate G, as a method of improving a defective phenomenon as described above. The pattern excluding structure included in the region G0 may be implemented by replacing the pattern shape in the region where the distortion occurs with a flat form.

Figure 9:
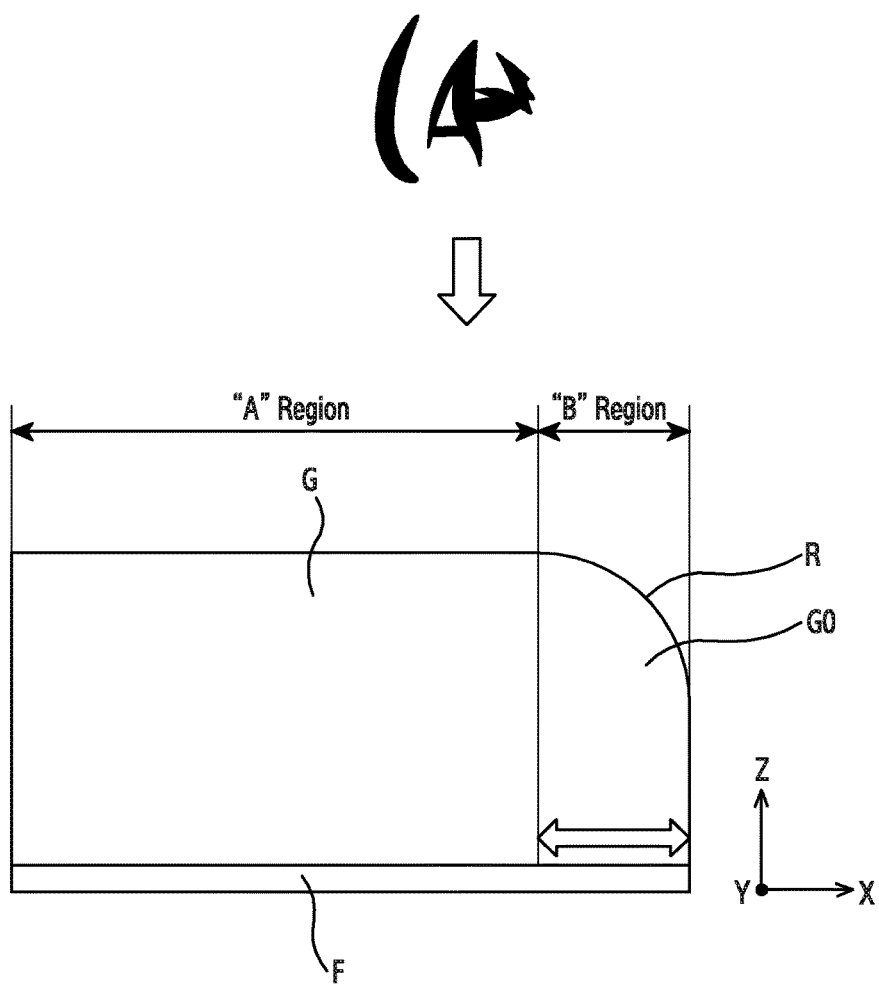
FIG. 9 is a view illustrating a portion of a transparent plate, in which a distortion phenomenon occurs, in an exterior surface mounting member according to various embodiments of the present disclosure, when an outermost edge of a transparent plate or a portion around an area of the transparent plate, in which a hole is formed, is viewed from a vertical direction.

FIG. 9 is a view illustrating a portion of a transparent plate, in which a distortion phenomenon occurs, in an exterior surface mounting member according to various embodiments of the present disclosure, when an outermost edge of a transparent plate or a portion around an area of the transparent plate, in which a hole is formed, is viewed from a vertical direction.

Figure 10:
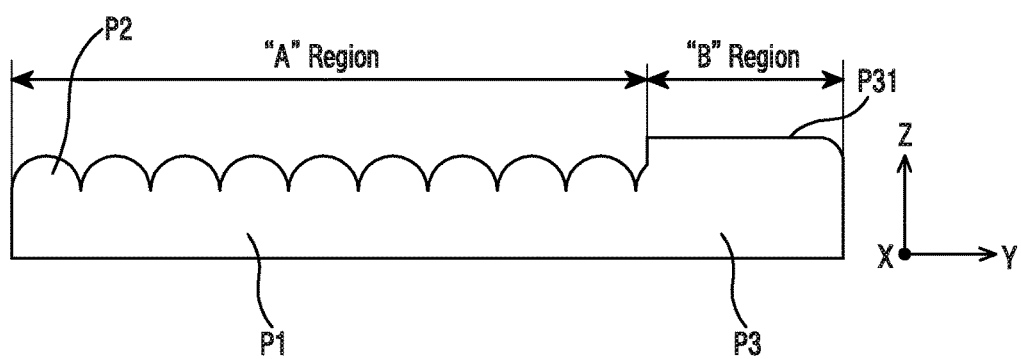
FIG. 10 is a view illustrating a non-patterned region that is formed by removing a portion of a pattern of a pattern layer, in which a distortion phenomenon occurs, in an exterior surface mounting member according to various embodiments of the present disclosure.

FIG. 10 is a view illustrating a non-patterned region that is formed by removing a portion of a pattern of a pattern layer, in which a distortion phenomenon occurs, in an exterior surface mounting member according to various embodiments of the present disclosure.

Figure 11A:
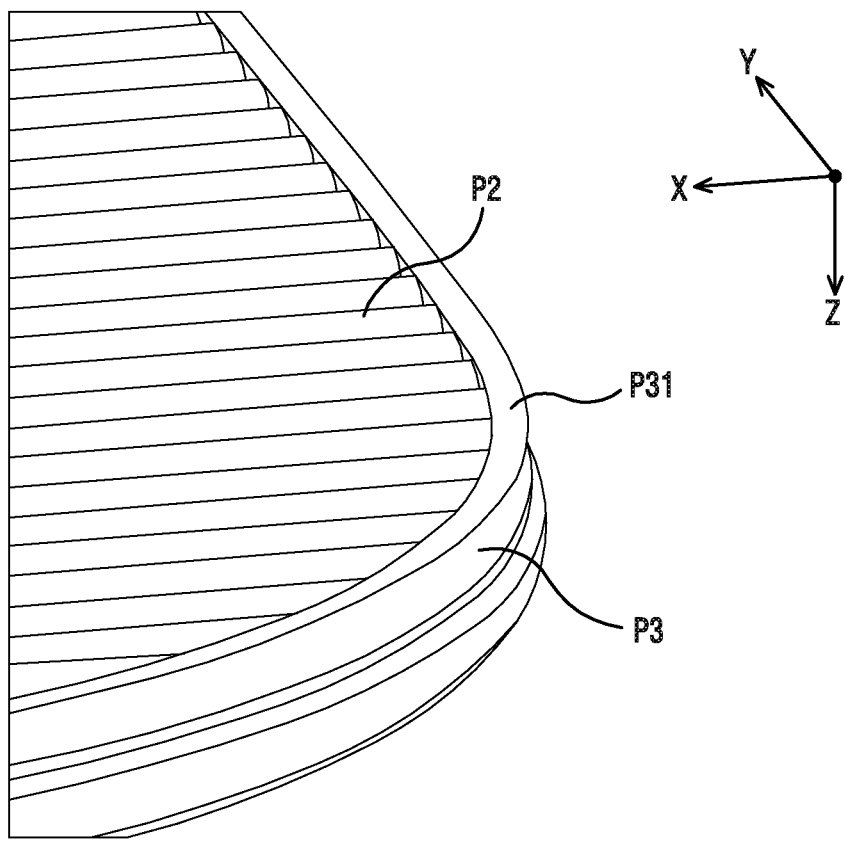
FIGS. 11A and 11B are perspective views, each of which illustrates a non-patterned region that is formed by removing a portion of a pattern of a pattern layer, in which a distortion phenomenon occurs, in an exterior surface mounting member according to various embodiments of the present disclosure.
Figure 11B:
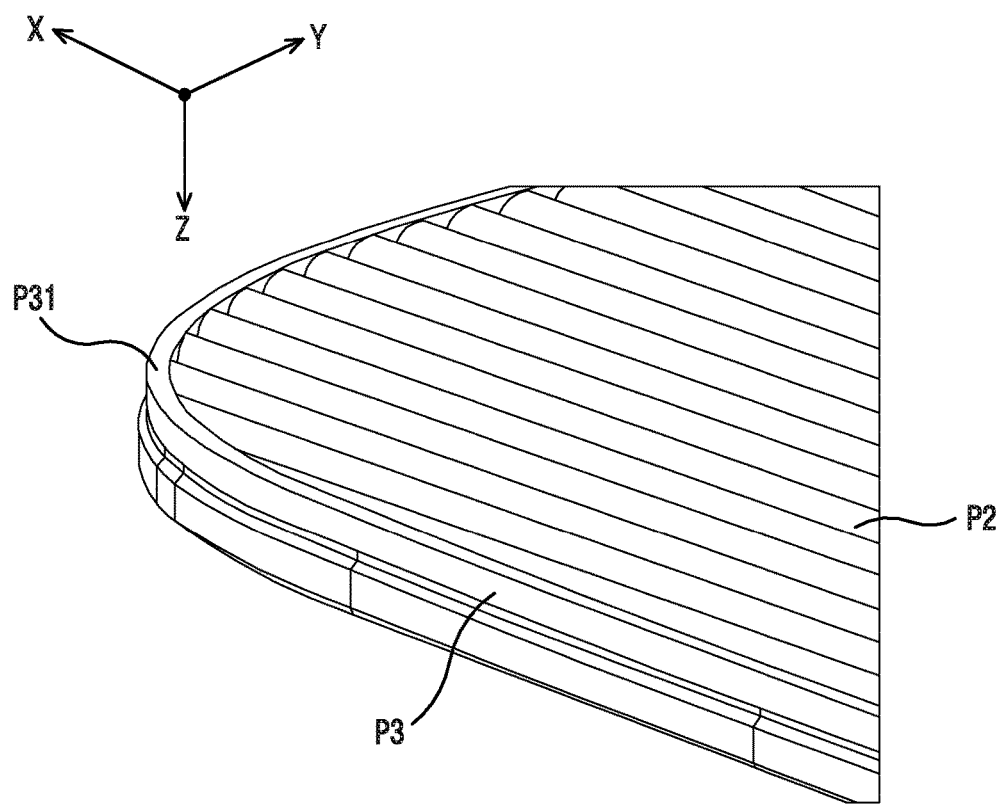

FIGS. 11A and 11B are perspective views, each of which illustrates a non-patterned region that is formed by removing a portion of a pattern of a pattern layer, in which a distortion phenomenon occurs, in an exterior surface mounting member according to various embodiments of the present disclosure.

Referring to FIGS. 9, 10, 11A, and 11B, according to various embodiments of the present disclosure, the exterior surface mounting member may further include a UV-curable molding portion P3 (e.g., a UV-curable resin region) in the shape of a flat surface P31, which is formed by removing the pattern of the pattern layer within a region within a defined distance from the peripheral region of the transparent plate G in the pattern region of the second UV-curable resin layer P2 such that the distortion phenomenon can be removed. At this time, the shape of the flat surface P31 may be substantially equal to or higher than the height of curved portions in the pattern layer P1.

According to various embodiments of the present disclosure, the non-patterned region ("B" region) may be formed within a region ("B" region) (0.1 mm) which is rounded at least due to polishing or other machining. According to various embodiments of the present disclosure, the rounded region ("B" region) may include a region (0.1 mm) from a location where the rounded shape (curvature) is initiated to a location where the transparent plate G is terminated when the transparent plate G is viewed vertically from a position above the transparent plate G. The non-patterned region may include a flat molding portion.

Figure 12:
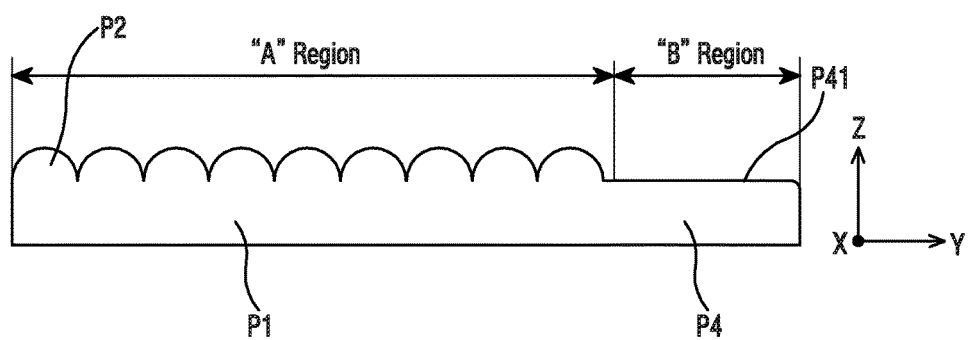
FIG. 12 is a view illustrating a non-patterned region that is formed by removing a portion of a pattern of a pattern layer, in which a distortion phenomenon occurs, in an exterior surface mounting member according to various embodiments of the present disclosure.

FIG. 12 is a view illustrating a non-patterned region that is formed by removing a portion of a pattern of a pattern layer, in which a distortion phenomenon occurs, in an exterior surface mounting member according to various embodiments of the present disclosure.

Figure 13:
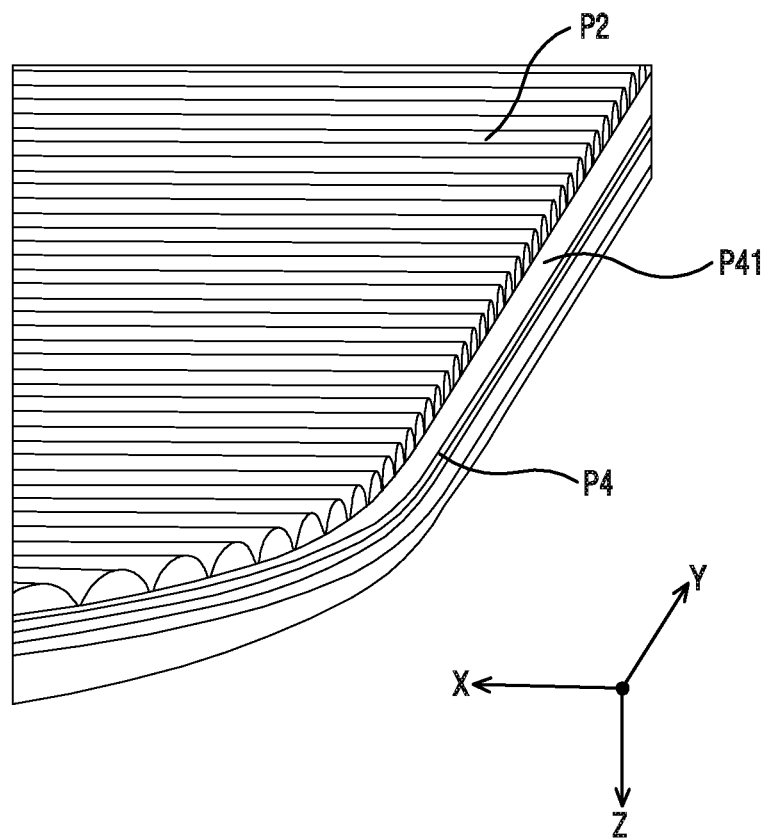
FIG. 13 is a perspective view illustrating a non-patterned region that is formed by removing a portion of a pattern of a pattern layer, in which a distortion phenomenon occurs, in an exterior surface mounting member according to various embodiments of the present disclosure.

FIG. 13 is a perspective view illustrating a non-patterned region that is formed by removing a portion of a pattern of a pattern layer, in which a distortion phenomenon occurs, in an exterior surface mounting member according to various embodiments of the present disclosure.

Referring to FIGS. 12 and 13, according to various embodiments of the present disclosure, the exterior surface mounting member may include a UV-curable molding portion P4 (e.g., a UV-curable resin region) in the shape of a flat surface P41, which is formed by removing the pattern of the pattern layer within a region within a defined distance from the peripheral region of the transparent plate G in the pattern region of the second UV-curable resin layer P2 such that the distortion phenomenon can be removed. According to various embodiments of the present disclosure, the UV molding portion P4 may be configured to have a thickness that is substantially similar to that of the first UV-curable resin layer P1. For example, the UV molding portion P4 may be configured to have a thickness that is smaller than that of the second UV-curable resin layer P2.

According to various embodiments of the present disclosure, the non-patterned region ("B" region) may be formed within a region ("B" region) (0.1 mm) which is rounded at least due to polishing or other machining. According to various embodiments of the present disclosure, the rounded region ("B" region) may include a region (0.1 mm) from a location where the rounded shape is initiated to a location where the transparent plate is terminated when the transparent plate is viewed vertically from a position above the transparent plate. The non-patterned region may include a flat curable resin region.

Figure 14:
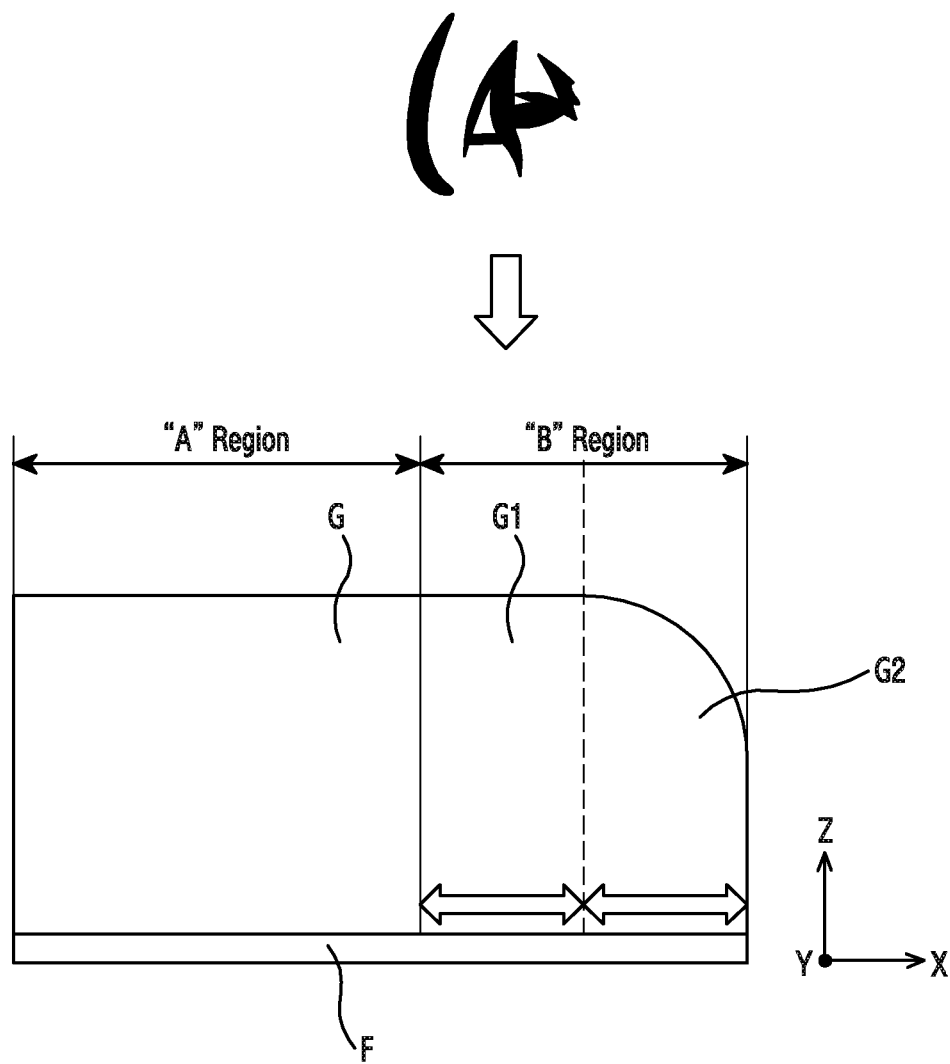
FIG. 14 is a view illustrating a portion of a transparent plate, in which a distortion phenomenon occurs, in an exterior surface mounting member according to various embodiments of the present disclosure, when an outermost edge of the transparent plate or a rounded region around an area of the transparent plate, in which a hole is formed, is viewed from a vertical direction.

FIG. 14 is a view illustrating a portion of a transparent plate, in which a distortion phenomenon occurs, in an exterior surface mounting member according to various embodiments of the present disclosure, when an outermost edge of the transparent plate or a rounded region around an area of the transparent plate, in which a hole is formed, is viewed from a vertical direction.

Figure 15:
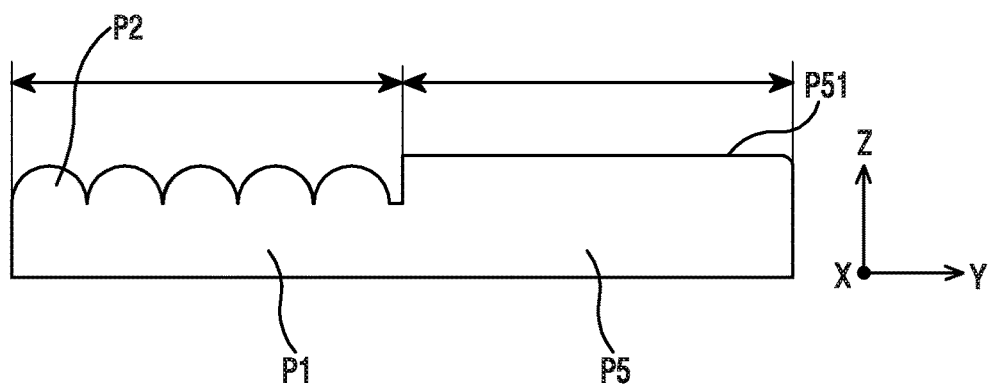
FIG. 15 is a view illustrating a non-patterned region that is formed by removing a portion of a pattern of a pattern layer, in which a distortion phenomenon occurs, in an exterior surface mounting member according to various embodiments of the present disclosure.

FIG. 15 is a view illustrating a non-patterned region that is formed by removing a portion of a pattern of a pattern layer, in which a distortion phenomenon occurs, in an exterior surface mounting member according to various embodiments of the present disclosure.

Figure 16:
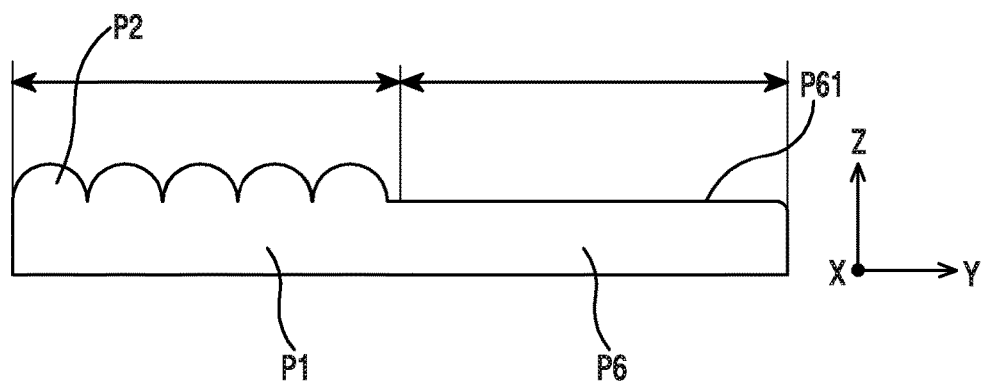
FIG. 16 is a view illustrating a non-patterned region that is formed by removing a portion of a pattern of a pattern layer, in which a distortion phenomenon occurs, in an exterior surface mounting member according to various embodiments of the present disclosure.

FIG. 16 is a view illustrating a non-patterned region that is formed by removing a portion of a pattern of a pattern layer, in which a distortion phenomenon occurs, in an exterior surface mounting member according to various embodiments of the present disclosure.

Referring to FIGS. 14, 15, and 16, in the case where the distorted region may be differently seen depending on the user's point of view in the exterior surface mounting member according to various embodiments of the present disclosure, the non-patterned region may be formed in a region ("B" region) region over the region G2 which is rounded at least due to polishing or other machining. The non-patterned region may further include a region G1 extending by a distance (0.1 mm) toward the inside of the pattern layer from the location where the rounded shape is initiated, in addition to the region G2 region from the location where the rounded shape is initiated to the location where the periphery of the window is terminated when the transparent plate G is viewed approximately vertically from a position above the transparent G. Accordingly, the non-patterned region ("B" region) may be provided to be wider than the "B" region of FIG. 10.

According to various embodiments of the present disclosure, the non-patterned region may be formed of a flat UV-curable molding portion P5 (see FIG. 15), or may be formed of a flat curable resin region P6 (see FIG. 16). The UV-curable molding portion P5 may be formed in a shape having a flat surface P51 (see FIG. 15), and the curable resin region P6 (see FIG. 16) may be formed in a shape having a flat surface P61.

Various embodiments of the present disclosure improve the distortion phenomenon that occurs in a decoration pattern layer, such as a window glass that is mounted on the exterior surface of an electronic device.

It will be evident to a person ordinarily skilled in the technical art, to which the present disclosure belongs, that the exterior surface mounting members of the present disclosure, which are improved in quality in the peripheral region of an electronic device, are not limited by the above-described embodiments and the accompanying drawings, and various substitutions, modifications, and changes can be made within the scope of the present disclosure.

Each of the above-described elements of the electronic device according to various embodiments of the present disclosure may be comprised of one or more components, and the names of the elements may vary according to the kind of the electronic device. The electronic device according to various embodiments of the present disclosure may include at least one of the above-described elements, and some of the elements may be omitted or an additional element may be further included. In addition, some of the elements of the electronic device according to various embodiments of the present disclosure may be combined into a single entity, and may perform the same functions as those of the elements before being combined.

It will be appreciated that various embodiments of the present disclosure according to the claims and description in the specification can be realized in the form of hardware, software or a combination of hardware and software.

Any such software may be stored in a computer readable storage medium. The computer readable storage medium stores one or more programs (software modules), the one or more programs comprising instructions, which when executed by one or more processors in an electronic device, cause the electronic device to perform a method of the present disclosure.

Any such software may be stored in the form of volatile or non-volatile storage, such as, for example, a storage device like a read-only memory (ROM), whether erasable or rewritable or not, or in the form of memory, such as, for example, random access memory (RAM), memory chips, device or integrated circuits or on an optically or magnetically readable medium, such as, for example, a compact disc (CD), digital versatile disc (DVD), magnetic disk or magnetic tape, and the like. It will be appreciated that the storage devices and storage media are various embodiments of the present disclosure of machine-readable storage that are suitable for storing a program or programs comprising instructions that, when executed, implement various embodiments of the present disclosure.

Accordingly, various embodiments of the present disclosure provide a program comprising code for implementing apparatus or a method as claimed in any one of the claims of this specification and a machine-readable storage storing such a program. Still further, such programs may be conveyed electronically through any medium, such as a communication signal carried over a wired or wireless connection and various embodiments of the present disclosure suitably encompass the same.

While the present disclosure has been shown and described with reference to various embodiments thereof, it will be understood by those skilled in the art that various changes in form and details may be made therein without departing from the spirit and scope of the present disclosure. as defined by the appended claims and their equivalents

What is claimed is:

1. An electronic device comprising:
an external housing including a first plate and a second plate that is directed opposite to the first plate; and
at least one electronic component that is included within the external housing,
wherein the first plate comprises:
a transparent plate including a first surface that forms an outer surface of the first plate, a second surface that is directed opposite to the first surface, and a rounded region including a region from a location where a rounded shape is initiated to a location where the transparent plate is terminated when the transparent plate is viewed atop from a position above the transparent plate, and
a structure that is interposed between the transparent plate and the second plate, and comprises a third surface that faces the first plate and a fourth surface that is formed opposite to the third surface, the structure including a transparent or translucent material,
wherein the transparent plate comprises:
a first region having a first thickness, and
a second region that is positioned adjacent to the first region and has a second thickness that is smaller than the first thickness,
wherein, when viewed from a cross section, a thickness from the second surface to the first surface in the second region is reduced in a direction away from the first region,
wherein the structure includes a pattern of repeated protrusions within a portion on the fourth surface which corresponds to the first region, and the protrusions are parallel to each other in a first direction,
wherein the structure further comprises on the fourth surface, a flat portion that is elongated in a portion corresponding to the second region,
wherein the flat portion comprises an edge portion existing between a front face and a rim of the electronic device or an interface portion existing between a rear face and the rim of the electronic device,
wherein the flat portion comprises an edge portion between the front face of the electronic device and a component existing on the front face or an interface portion between the rear face of the electronic device and a component existing on the rear face, and
wherein, when the transparent plate is viewed atop, the rounded region is overlapped with the flat portion.

2. The electronic device of claim 1, further comprising:
a display that is exposed through the second plate.

3. The electronic device of claim 1, further comprising:
a display that is exposed through a portion of the first plate,
wherein, when viewed from a position above the first plate, the first region and the second region are formed outside the display.

4. The electronic device of claim 1, wherein the flat portion protrudes more than the protrusions toward the second plate.

5. The electronic device of claim 1, wherein the flat portion protrudes toward the second plate less than the protrusions.

6. The portable electronic device of claim 1,
wherein the first plate forms a front face of the portable electronic device, and
wherein the second plate forms a rear face of the portable electronic device.

* * * * *